(12) United States Patent
Xia et al.

(10) Patent No.: US 8,502,320 B2
(45) Date of Patent: Aug. 6, 2013

(54) ZENER DIODE STRUCTURE AND PROCESS

(75) Inventors: Wei Xia, Irvine, CA (US); Xiangdong Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 115 days.

(21) Appl. No.: 13/250,563

(22) Filed: Sep. 30, 2011

(65) Prior Publication Data

US 2013/0082330 A1    Apr. 4, 2013

(51) Int. Cl.
*H01L 21/70* (2006.01)
(52) U.S. Cl.
USPC ............ 257/368; 257/E21.632; 438/200
(58) Field of Classification Search
USPC .......... 257/368, E21.632, E21.507, E27.062; 438/200, 675
See application file for complete search history.

(56) References Cited

U.S. PATENT DOCUMENTS

| 7,888,775 | B2 * | 2/2011 | Russ et al. | 257/547 |
| 2004/0124443 | A1 * | 7/2004 | Yoshida | 257/260 |
| 2005/0098832 | A1 * | 5/2005 | Yoshida | 257/368 |
| 2006/0022265 | A1 * | 2/2006 | Yoshida et al. | 257/335 |

* cited by examiner

*Primary Examiner* — Shaun Campbell
(74) *Attorney, Agent, or Firm* — Sterne, Kessler, Goldstein & Fox P.L.L.C.

(57) ABSTRACT

A vertically stacked, planar junction Zener diode is concurrently formed with epitaxially grown FET raised S/D terminals. The structure and process of the Zener diode are compatible with Gate-Last high-k FET structures and processes. Lateral separation of diode and transistor structures is provided by modified STI masking. No additional photolithography steps are required. In some embodiments, the nonjunction face of the uppermost diode terminal is silicided with nickel to additionally perform as a copper diffusion barrier.

20 Claims, 8 Drawing Sheets

Fig. 8 under the guidance and control of the first clause does not limit other claims to that same meaning or scope.

ZENER DIODE STRUCTURE AND PROCESS

FIELD OF THE INVENTION

The present invention relates generally to diodes, and more particularly relates to Zener diodes structures integrated with field effect transistors, and processes for making same.

BACKGROUND

Advances in semiconductor manufacturing technologies have resulted in dramatically increased circuit packing densities and higher speeds of operation. In order to achieve such increased densities a wide variety of evolutionary changes have taken place with respect to semiconductor processing techniques and semiconductor device structures over the years.

Some of the more recent changes in semiconductor processing and device structures include gate replacement, where polysilicon gate electrode structures are removed after source/drain formation, and a high-k gate dielectric layer with a metal gate electrode are provided in their place; and source/drain terminal formation by epitaxial growth of p+ and n+ layers. In connection with source/drain terminal formation by epitaxial growth, some modern processes provide recesses adjacent a gate electrode structure, prior to gate replacement, in which a first conductivity type epitaxial layer is formed. Similarly, such processes may provide raised source/drain terminals adjacent a different gate electrode structure prior to gate replacement. These raised source/drain terminals may be formed by epitaxial growth without first forming a recess.

In addition to the formation of transistors, semiconductor processes are also used to create other active and passive electrical components. An example of another active electrical component is the diode. Diode structures result when semiconductor material of a first conductivity type and a second conductivity type are formed adjacent to each other. Given the appropriate relative doping profiles, such diodes may have the electrical performance characteristics that put them in a class of diodes referred to as Zener diodes.

A Zener diode is a special kind of diode that allows current to flow in the forward direction just as an ideal diode does, and also allows current to flow in the reverse direction when the voltage is above the breakdown voltage without suffering the thermal damage that can be experienced by non-Zener diodes operating in breakdown mode. Zener diodes are widely used as voltage references and as shunt regulators to regulate the voltage across small circuits. The operation and electrical characteristics of a Zener diode depends on the heavy doping of its p-n junction to allow electrons to tunnel from the valence band of the p-type material to the conduction band of the n-type material. Some conventionally formed Zener diodes, made in processes that integrate the formation of field effect transistors and Zener diodes, require the use the interface of a lateral n+ and p+ structure to form the Zener diode junction. Such conventional a Zener diode structure requires a large amount of die area and tends to exhibit undesirably high leakage current.

What is needed are diode structures that are compatible with the formation of epitaxially formed, raised source/drain terminals in gate-last, high-k MOSFET integrated circuits.

BRIEF DESCRIPTION OF THE DRAWINGS

Embodiments of the invention are described with reference to the accompanying drawings. In the drawings, like reference numbers indicate identical or functionally similar elements. Additionally, the left most digit(s) of a reference number identifies the drawing in which the reference number first appears.

DETAILED DESCRIPTION

The following Detailed Description refers to accompanying drawings to illustrate exemplary embodiments consistent with the invention. References in the Detailed Description to "one exemplary embodiment," "an illustrative embodiment", "an exemplary embodiment," and so on, indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the invention. Therefore, the Detailed Description is not meant to limit the invention. Rather, the scope of the invention is defined only in accordance with the following claims and their equivalents.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

TERMINOLOGY

The terms, chip, die, integrated circuit, semiconductor device, and microelectronic device, are often used interchangeably in the field of electronics. The present invention is applicable to all the above as these terms are generally understood in the field.

With respect to chips, it is common that power, ground, and various signals may be coupled between them and other circuit elements via physical, electrically conductive connections. Such a point of connection may be referred to as an input, output, input/output (I/O), terminal, line, pin, pad, port, interface, or similar variants and combinations. Although connections between and amongst chips are commonly made by way of electrical conductors, those skilled in the art will appreciate that chips and other circuit elements may alternatively be coupled by way of optical, mechanical, magnetic, electrostatic, and electromagnetic interfaces.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, such as aluminum (Al), copper (Cu), an alloy of Al and Cu, an alloy of Al, Cu and silicon (Si), tungsten (W), and nickel (Ni) are conductors that provide signal paths for coupling or interconnecting, electrical circuitry. Other conductors, both metal and non-metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to in this field as polysilicon, or sometimes more simply as poly.

Epitaxial layer refers to a layer of single crystal semiconductor material. In this field, the epitaxial layer is commonly referred to "epi."

FET, as used herein, refers to metal-oxide-semiconductor field effect transistors (MOSFETs). An n-channel FET is referred to herein as an NFET. A p-channel FET is referred to herein as a PFET.

As used herein, "gate" refers to the insulated gate terminal of a FET.

Source/drain (S/D) terminals refer to the terminals of a FET, between which conduction occurs under the influence of an electric field, subsequent to the inversion of the semiconductor surface under the influence of an electric field resulting from a voltage applied to the gate terminal of the FET. Generally, the source and drain terminals of a FET are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

The terms contact and via, both refer to structures for electrical connection of conductors from different interconnect levels. These terms are sometimes used in the art to describe both an opening in an insulator in which the structure will be completed, and the completed structure itself. For purposes of this disclosure, contact and via both refer to the completed structure.

Substrate, as used herein, refers to the physical object that is the basic workpiece that is transformed by various process operations into the desired microelectronic configuration. A substrate may also be referred to as a wafer. Wafers, may be made of semiconducting, non-semiconducting, or combinations of semiconducting and non-semiconducting materials.

The term vertical, as used herein, means substantially perpendicular to the surface of a substrate.

Overview

It is well-known that various changes in semiconductor device structures have been, and continue to be, made in order to accommodate the manufacturing process requirements to produce ever smaller electrical components on integrated circuits. Some processes, such as recent CMOS processes that include gate replacement (i.e., gate-last, high-k) also include the formation of FET S/D terminals by epitaxial growth, wherein S/D terminals of a first conductivity type are formed in recesses, and S/D terminals of a second conductivity type are formed without recesses (i.e., raised S/D terminals).

In accordance with the present invention, the process steps provided by these aforementioned CMOS processes are adapted to produce a vertically stacked, planar junction Zener diode structure with anode and cathode contacts on the same side of the wafer.

Process

FIGS. 1-8 illustrate a process for forming a Zener diode in accordance with the present invention. The figures illustrate various components, their arrangements, and interconnections. Unless expressly stated to the contrary, the figures are not necessarily drawn to scale.

Figure 1:
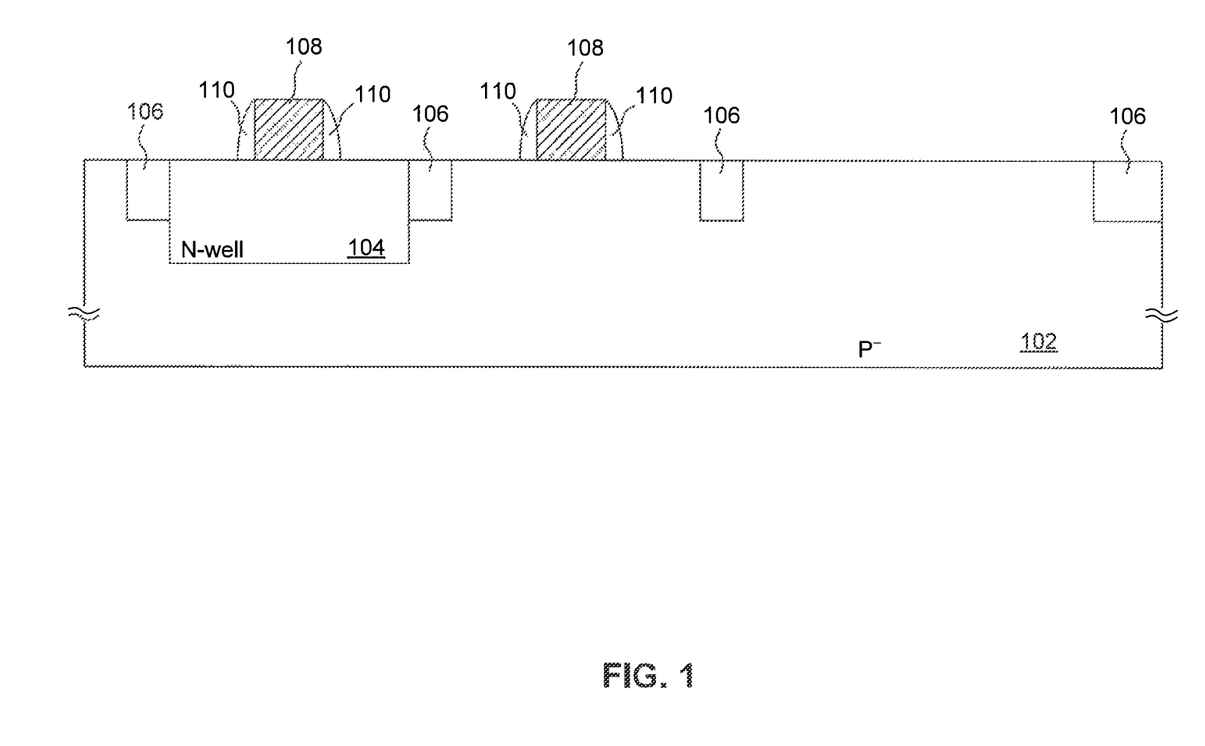
FIG. 1 is a cross-sectional view of a portion of a wafer having a partially fabricated integrated circuit thereon.

FIG. 1 is a cross-sectional view of a portion of a p-type wafer substrate 102 having a partially fabricated integrated circuit thereon, the integrated circuit including an n-well 104 in the p-substrate 102; shallow trench isolation (STI) structures 106 separating n-well 104 from at least a portion of p-substrate 102, and further isolating a region of p-substrate 102 in which a vertically stacked, planar junction Zener diode structure is to be formed; and gate structures 108 with sidewall spacers 110, the gate structures 108 being suitable for removal and replacement with a high-k dielectric material and a metal gate. In this illustrative embodiment, gate structures 108 are formed from polycrystalline silicon, and STI structures are filled with dielectric material.

It is noted that the present invention is not limited to vertically stacked, planar junction Zener diode structures that are completely surrounded by STI structures.

Figure 2:
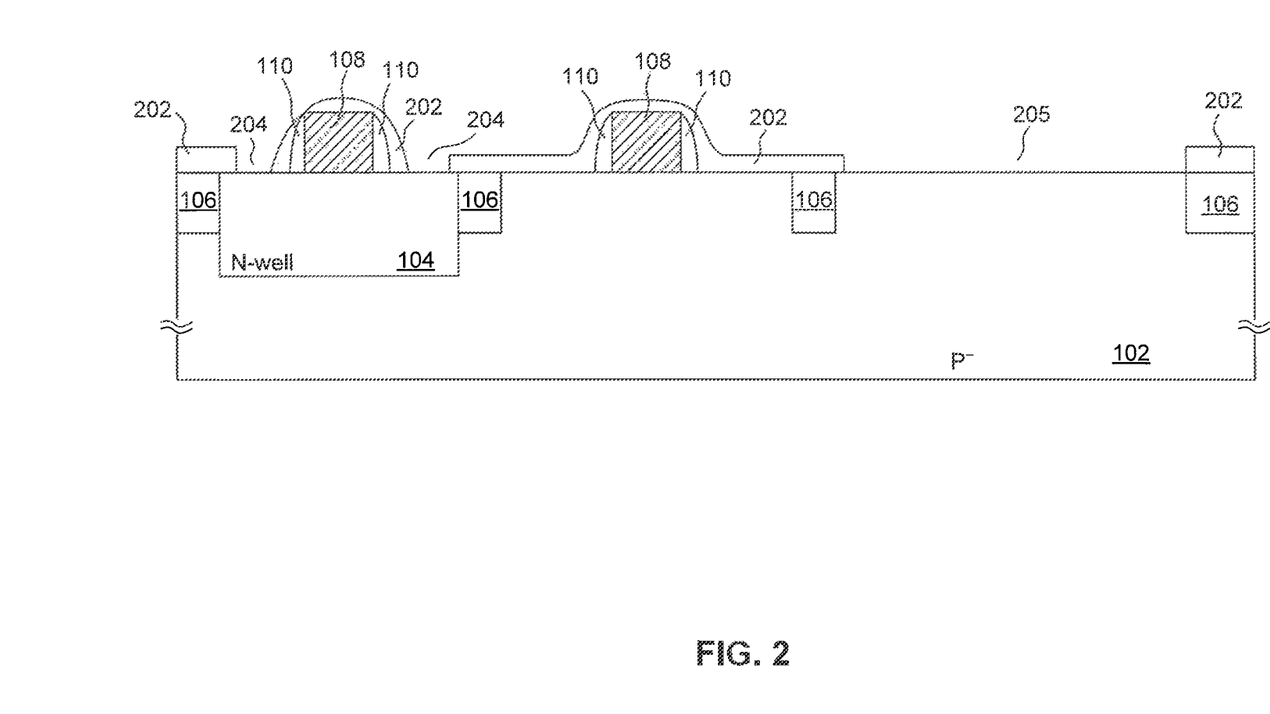
FIG. 2 shows the structure of FIG. 1 after a first hardmask layer has been deposited, and then patterned to expose areas in which recesses are to be formed for subsequent p+ epi growth.

FIG. 2 shows the structure of FIG. 1 after a first hardmask layer 202 has been deposited, and then patterned to expose areas 204, 205 in which recesses are to be formed for subsequent p+ epi growth. First hardmask 202 is typically formed from silicon nitride, but the present invention is not limited to any particular masking material.

Figure 3:
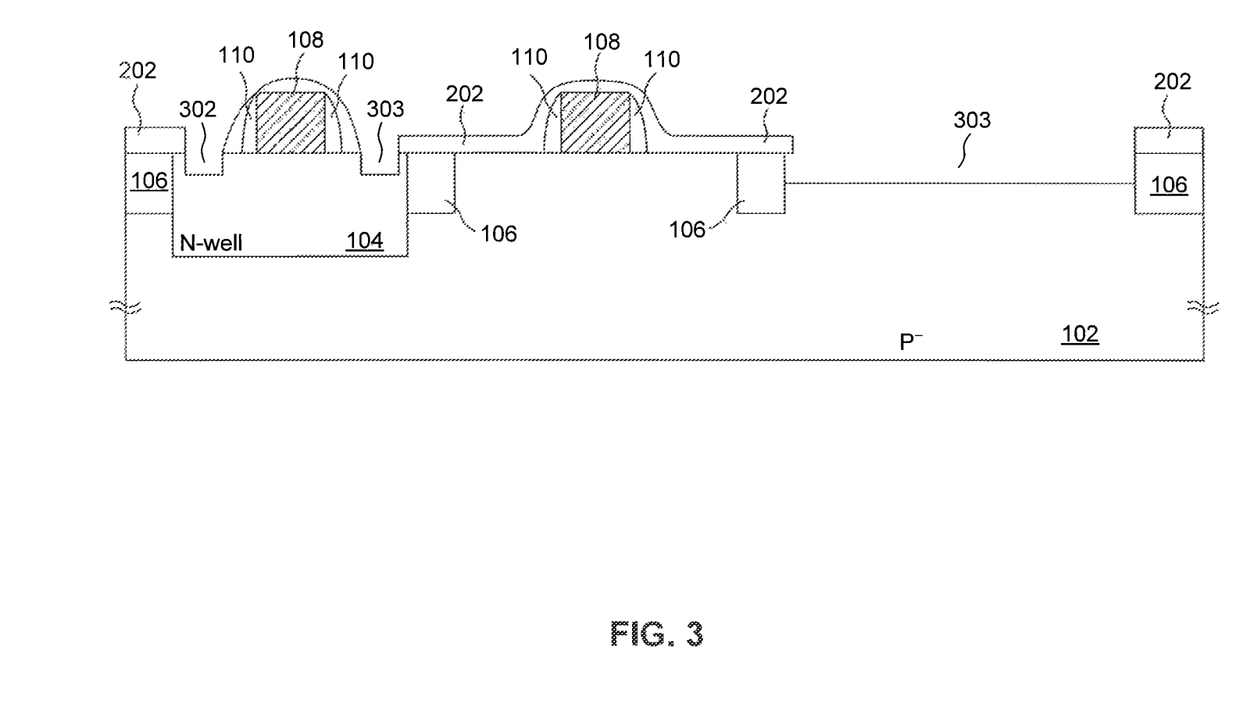
FIG. 3 shows the structure of FIG. 2 after recesses are formed for PFET source/drains (S/D) and a Zener diode anode.

FIG. 3 shows the structure of FIG. 2 after recesses 302, 303 are formed for PFET source/drains (S/D) and a Zener diode anode respectively. Recesses 302 are formed in n-well 104 and recess 303 is formed in p-substrate 102. It is noted that because the doping types and concentrations in the n-well 104 and the p-substrate 102 are different from each other, their removal rates when simultaneously exposed to the same etch chemistry will be different. However, this difference is generally too small to require separate etching steps for the n-well and p-substrate. Those skilled in the field will readily determine, without undue experimentation, whether any particular implementation of the present invention requires the separate etch steps and the costs associated with the additional processing.

Figure 4:
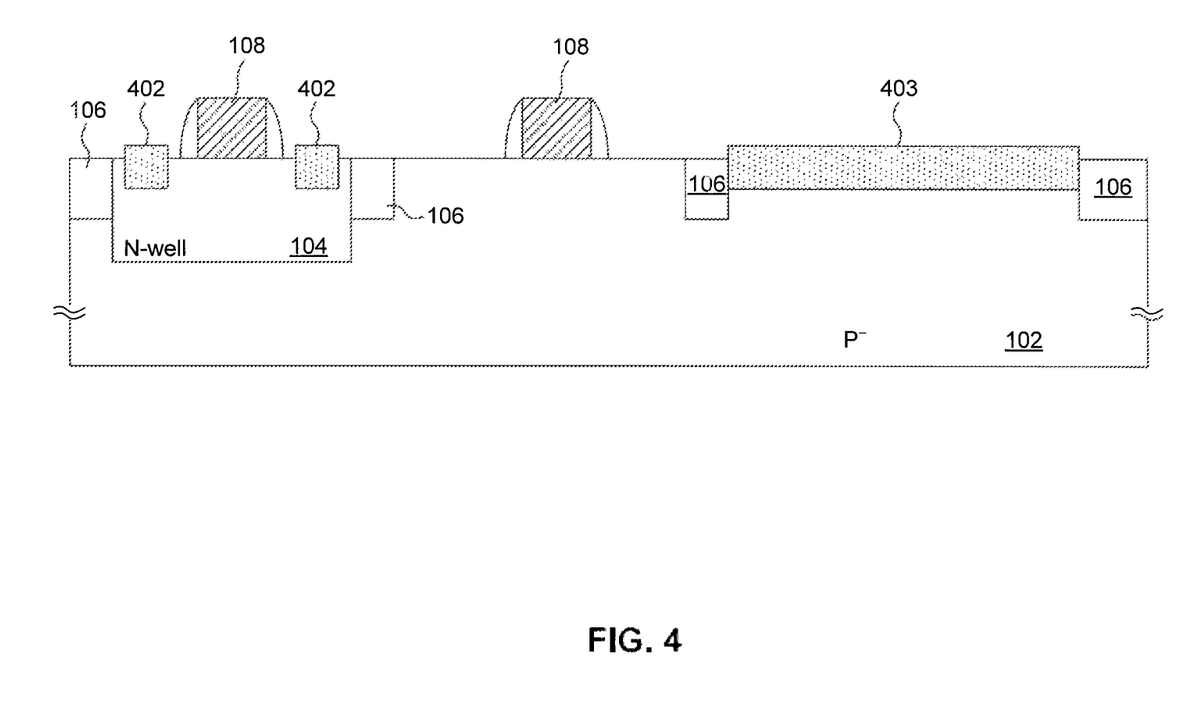
FIG. 4 shows the structure of FIG. 3 after P+ epi growth forms the PFET source/drain (S/D) terminals and the Zener diode anode; and after the first hardmask has been removed.

FIG. 4 shows the structure of FIG. 3 after p+ epi growth forms the PFET S/D's 402 and the Zener diode anode 403; and after the first hardmask has been removed. Epitaxial growth processes are well-known in the field of semiconductor manufacturing and are not described in greater detail here. In typical embodiments, the first hardmask is formed from silicon nitride, and may be removed with conventional silicon nitride etch processing. In an alternative embodiment the first hardmask remains on the surface and a second hardmask layer is deposited over the wafer and then patterned to expose openings for the formation of NFET raised S/D terminals and cathode side of the diode by n+ epi growth.

Figure 5:
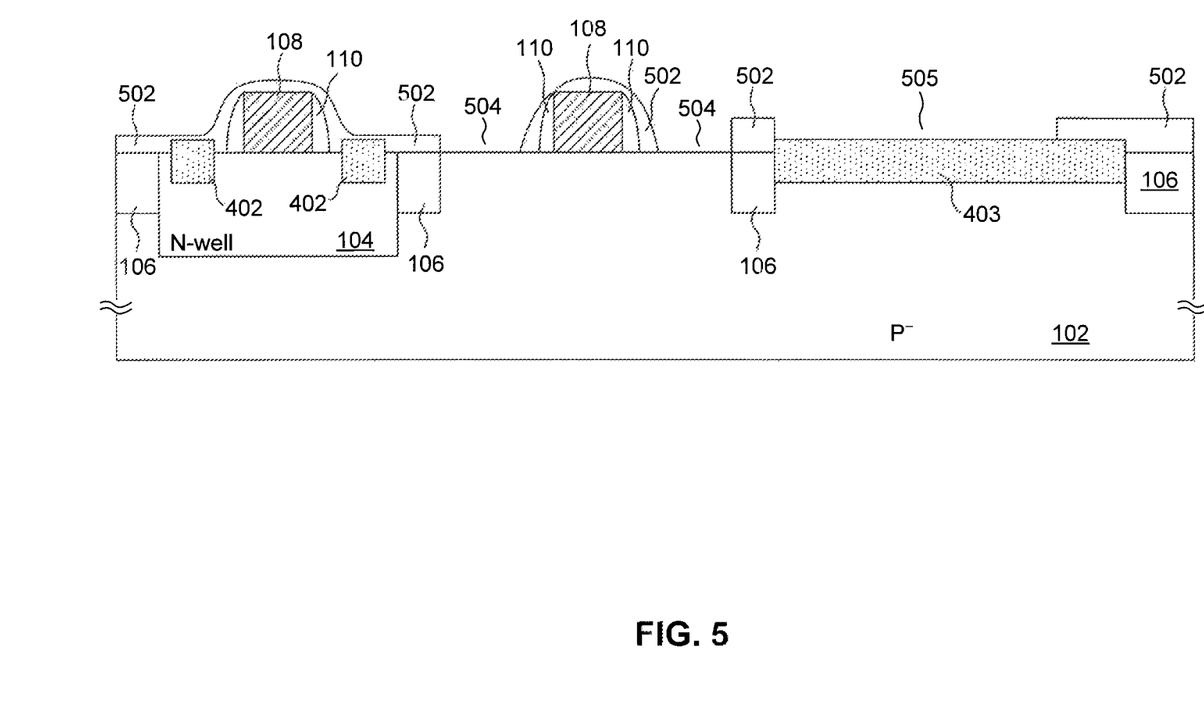
FIG. 5 shows the structure of FIG. 4 after a second hardmask layer has been deposited and patterned to expose areas in which n+ epi growth is to take place to form NFET S/D terminals and a Zener diode cathode.

FIG. 5 shows the structure of FIG. 4 after a second hardmask layer 502 has been deposited and patterned to expose areas 504, 505 in which n+ epi growth is to take place to form NFET S/D's and a Zener diode cathode respectively. The second hardmask 502 is typically formed from silicon nitride. It is noted opening 505 does not expose the entire surface region of anode 403. In this way, a portion of the p+ is available for the formation of a contact.

In an alternative process flow, the entire surface of anode 403 could be exposed by an opening in hardmask 502, and the covered by an n+ epi layer. However, this has the disadvantage that a further masking and etching operation would be needed to expose a region of anode 403 on which to make electrical contact.

Figure 6:
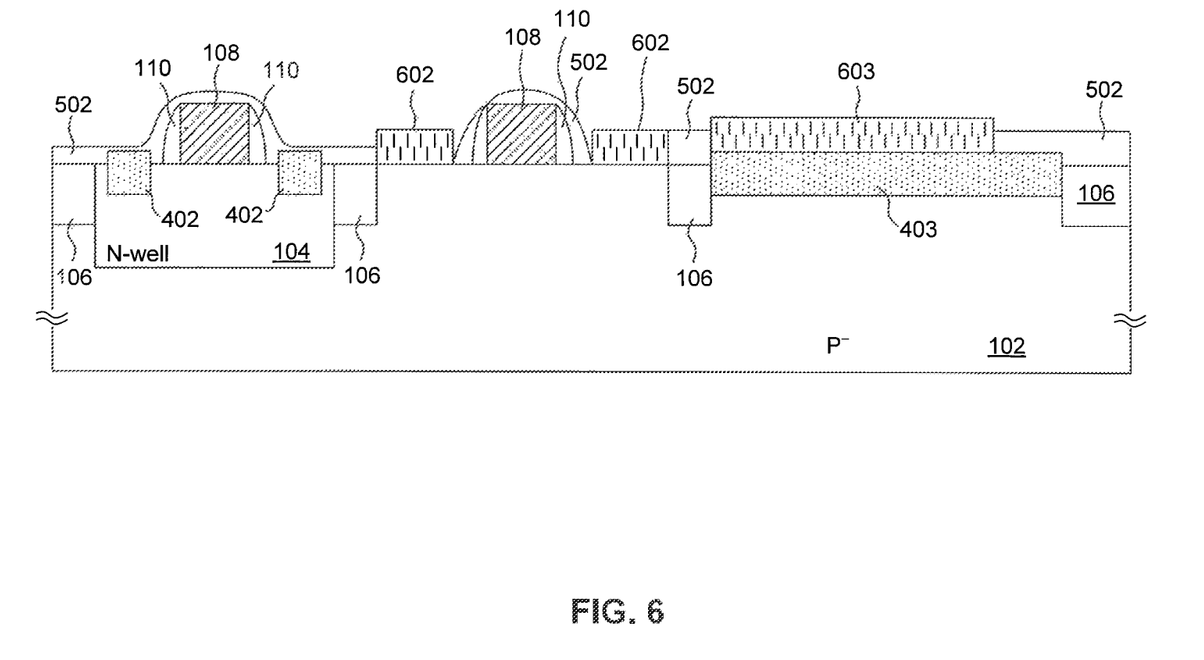
FIG. 6 shows the structure of FIG. 5 after n+ epi growth forms NFET S/D terminals and a Zener diode cathode.

FIG. 6 shows the structure of FIG. 5 after n+ epi growth forms NFET raised S/D terminals 602 and a Zener diode cathode 603. In this way, cathode 603 is formed simultaneously with the same epitaxial growth process that forms the NFET raised S/D's 602.

Figure 7:
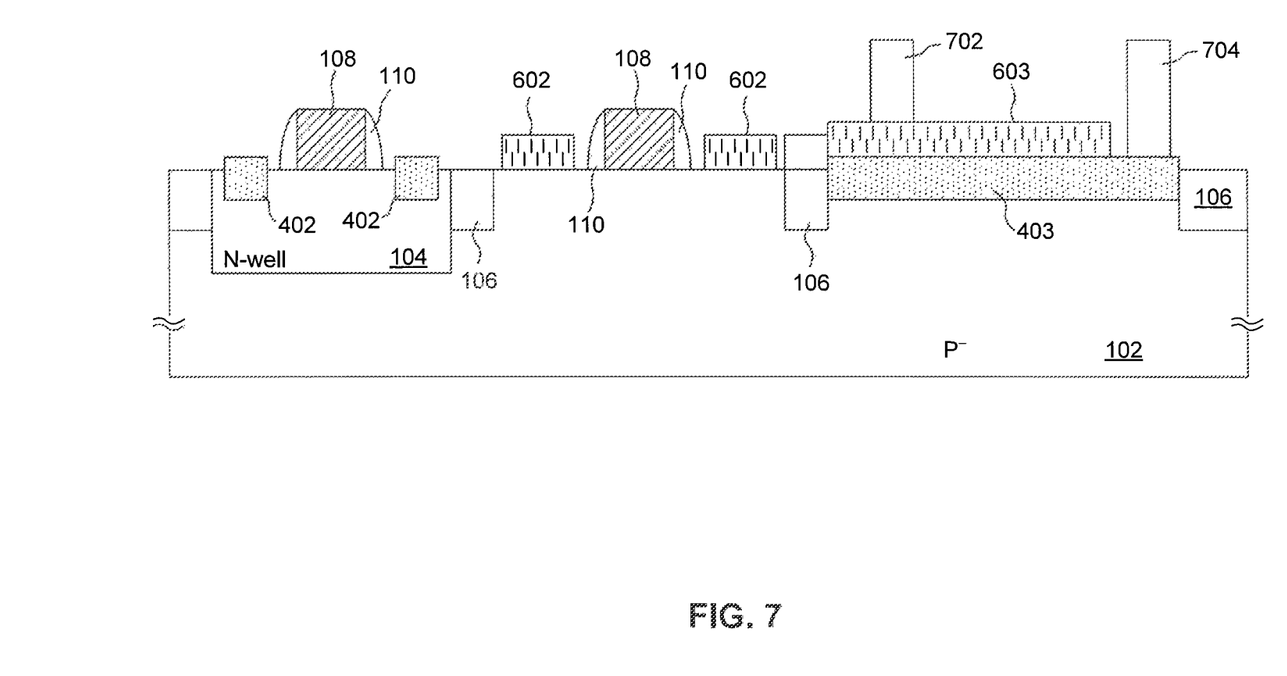
FIG. 7 shows the structure of FIG. 6 after the second hardmask has been removed, and contact structures have been formed to make electrical contact with both the anode (i.e., p+) and the cathode (i.e., n+) of the Zener diode.

FIG. 7 shows the structure of FIG. 6 after the second hardmask 502 has been removed, and contact structures 702, 704 have been formed to make electrical contact with both the anode (i.e., p+) 403 and the cathode (i.e., n+) 603 of the Zener diode. In some embodiments contacts 702, 704 are formed from copper (Cu). It is well-known in the field of semiconductor manufacturing that prior to Cu plating, a barrier layer is formed in the trenches in which the Cu structures are plated up. In some embodiments of the present invention, before the contact structures are formed, the exposed surfaces of anode 403 and cathode 603 are silicided. In some embodiments, a Ni silicide layer is formed on the exposed surfaces of anode 403 and cathode 603 prior to the formation of contact structures 702, 704.

It is noted that the height of contact structure 702 is less than that of contact structure 704 and further noted that the top surfaces of contact structures 702, 704 are substantially coplanar. Contact structure 704 has a greater height because it is based on a relatively lower layer, anode 403, whereas contact structure 702 is based on the relatively higher layer, cathode 603. In typical embodiments, the top surfaces of contact structures 702, 704 are formed by the same chemical-mechanical polishing (CMP) operation, and therefore are substantially coplanar. In this context, substantially coplanar means that within the manufacturing tolerances of the CMP operation, the top surfaces of contact structures 702, 704 are in the same plane. The present invention is not limited to any particular CMP pads, pad conditioning, slurry composition, flow rates, temperatures, contact pressures, rotation speeds, and so on.

Subsequent to the formation of the raised S/D terminals and diode, conventional process steps may be performed to complete the transistors (e.g., gate replacement) and interconnection (e.g., multiple layers of interconnect lines).

Structure

FIG. 7, discussed above in connection with an illustrative process flow, shows the structure of a vertically stacked, planar junction diode structure. In the illustrative stricture of FIG. 7, a region of p-type substrate 102 is defined by an enclosing it with STI structure 106. A recess formed in the surface of the defined region has a p+ epitaxial layer 403 formed therein. The depth of the recess, and thickness and doping concentration of p+ epitaxial layer 403 are substantially the same as those of the PFET S/D terminals 402. It is noted that slight variations in the recess depths for the PFET S/D terminals and the diode anode layer may be different because they are formed in regions of the substrate having different dopant types and this may cause some difference in etch rates with respect to a givet etch chemistry. These small differences do not adversely affect the electrical characteristics of the diode. An n+ epitaxial layer 603 is formed on top of the p+ epitaxial layer 403.

Still referring to FIG. 7, each of the diode junction layers 403, 603 is provided with a contact structure 704, 702. The present invention is not limited to any particular relative positioning of contact structures 702, 704. In other words, the contact structures may be placed anywhere within the diode region, the contact structures may have any shape, and there may be more than one contact structure disposed on either of the diode junction layers.

Thus, vertically stacked, planar junction diode structures that are compatible with the formation of epitaxially formed, raised source/drain terminals in gate-last, high-k MOSFET integrated circuits have been described.

In one illustrative embodiment of the present invention an integrated circuit, includes a substrate of a first conductivity type; a well of a second conductivity type disposed in the substrate; a first gate electrode structure disposed over the well; a second gate electrode structure disposed over the substrate outside the area of the well; a first set of S/D terminals disposed in corresponding recesses in the well, the first set of S/D terminals adjacent to the first gate electrode structure; a first planar diode junction of the first conductivity type disposed in a recess in the substrate, the recess formed in a region of the substrate outside of the well; a second set of S/D terminals disposed on the surface of the substrate, the second set of S/D terminals adjacent to the second gate electrode structure; and a second planar diode junction of the second conductivity type disposed over at least a portion of the first planar diode junction. Typical embodiments further include a first contact structure in electrical contact with the first planar diode junction; and a second contact structure in electrical contact with the second planar diode junction. In this illustrative embodiment, the first conductivity type is p-type and the second conductivity type is n-type. In various embodiments of the present invention, the well is at least partially isolated from the substrate by a first STI structure, and the first planar diode junction is at least partially isolated from the substrate by a second STI structure. In the illustrative embodiment, both the first planar diode junction and the second planar diode junction are epitaxial layers.

Figure 8:
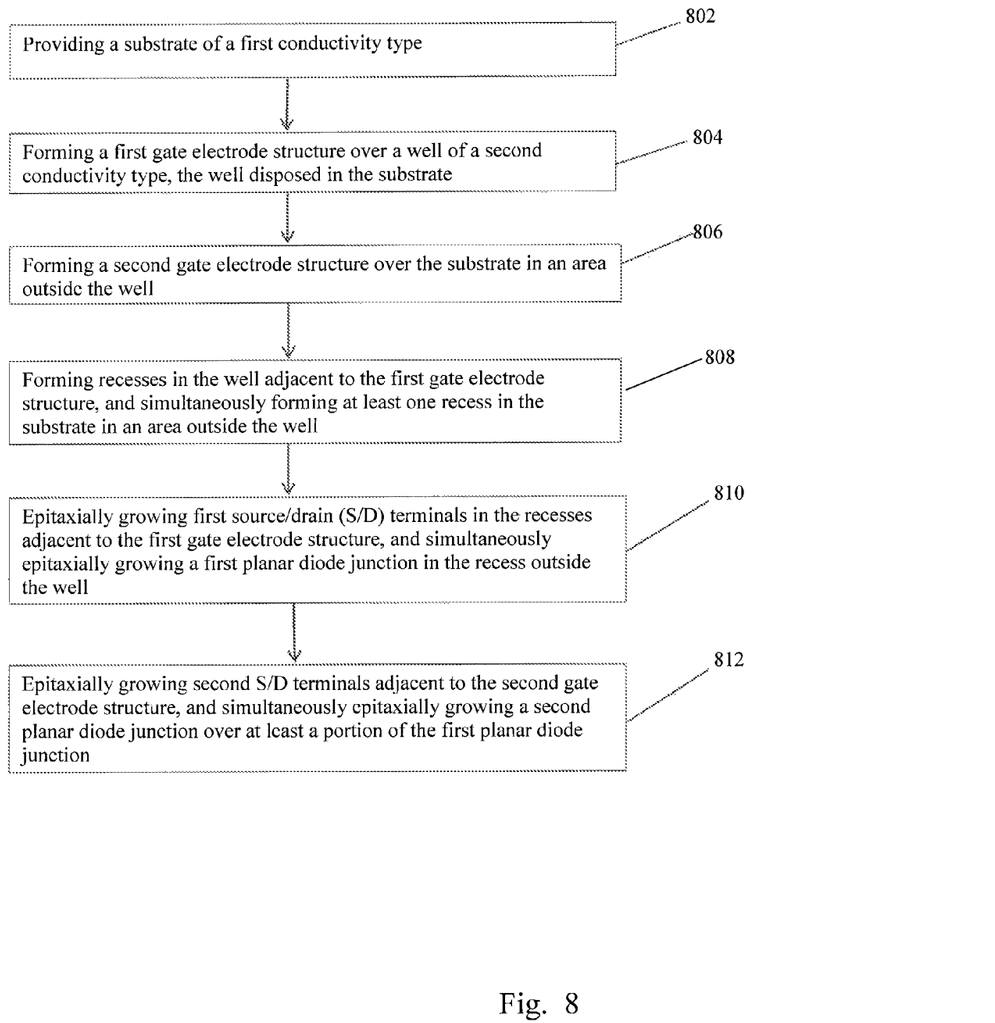
FIG. 8 is a flow diagram of an illustrative process in accordance with the present invention.

In an illustrative method in accordance with the present invention, and shown in FIG. 8, forming an integrated circuit including PFETs, NFETs, and at least one vertically stacked, planar junction Zener diode, includes providing 802 a substrate of a first conductivity type; forming 804 a first gate electrode structure over a well of a second conductivity type, the well disposed in the substrate; forming 806 a second gate electrode structure over the substrate in an area outside the well; forming 808 recesses in the well adjacent to the first gate electrode structure, and simultaneously forming at least one recess in the substrate in an area outside the well; epitaxially growing 810 first source/drain (S/D) terminals in the recesses adjacent to the first gate electrode structure, and simultaneously epitaxially growing 812 a first planar diode junction in the recess outside the well; and epitaxially growing second S/D terminals adjacent to the second gate electrode structure, and simultaneously epitaxially growing a second planar diode junction over at least a portion of the first planar diode junction; wherein the second S/D terminals are raised S/D terminals. Such a method typically further includes forming a plurality of shallow trench isolation (STI) structures in the substrate; wherein both the well and the first planar diode junction are at least partially isolated from the substrate by STI structures. Subsequent to formation of a vertically stacked, planar junction diode, such illustrative processes further include removing the polysilicon gate electrodes and forming metal gate electrodes over a high-k gate dielectric layer.

Various embodiments of the present invention may be implemented with twin-well processes, such that a vertically stacked, planar junction Zener diode structure is disposed in a well rather than in the bulk substrate.

CONCLUSION

It is to be appreciated that the Detailed Description section, and not the Abstract of the Disclosure, is intended to be used to interpret the claims. The Abstract of the Disclosure may set forth one or more, but not all, exemplary embodiments of the invention, and thus, is not intended to limit the invention and the subjoined Claims in any way.

It will be apparent to those skilled in the relevant art(s) that various changes in form and detail can be made therein without departing from the spirit and scope of the invention. Thus the invention should not be limited by any of the above-described exemplary embodiments, but should be defined only in accordance with the subjoined Claims and their equivalents.

What is claimed is:

1. An integrated circuit, comprising:
a substrate of a first conductivity type;
a well of a second conductivity type disposed in the substrate;
a first gate electrode structure disposed over the well;
a second gate electrode structure disposed over the substrate outside the area of the well;
a first set of source/drain (S/D) terminals disposed in corresponding recesses in the well, the first set of S/D terminals adjacent to the first gate electrode structure;
a first planar diode junction layer of the first conductivity type disposed in a recess in the substrate, the recess located in a region of the substrate outside of the well;
a second set of S/D terminals disposed on a surface of the substrate, the second set of S/D terminals adjacent to the second gate electrode structure; and
a second planar diode junction layer of the second conductivity type disposed over at least a portion of the first planar diode junction layer.

2. The integrated circuit of claim 1, further comprising a first contact structure in electrical contact with the first planar diode junction layer; and a second contact structure in electrical contact with the second planar diode junction layer.

3. The integrated circuit of claim 1, wherein the first conductivity type is p-type and the second conductivity type is n-type.

4. The integrated circuit of claim 1, wherein the well is at least partially isolated from the substrate by a first shallow trench isolation (STI) structure, and the first planar diode junction layer is at least partially isolated from the substrate by a second STI structure.

5. The integrated circuit of claim 3, wherein the first planar diode junction layer is an epitaxial layer and the second planar diode junction layer is an epitaxial layer.

6. The integrated circuit of claim 2, wherein the first contact structure has a first height, the second contact structure has a second height, and the first and second heights are different.

7. The integrated circuit of claim 6, wherein the first height is greater than the second height.

8. The integrated circuit of claim 2, wherein the first contact structure has a first end abutting the first planar diode junction layer, and a second end; the second contact structure has a first end abutting the second planar diode junction layer, and a second end; and the second end of the first contact structure and the second end of the second contact structure are substantially coplanar.

9. The integrated circuit of claim 2, further comprising:
a first silicide layer disposed on a first surface of the first planar diode junction layer, and a second silicide layer disposed on a first surface of the second planar diode junction layer;
wherein the first contact structure has a first end abutting the first silicide layer, and a second end; the second contact structure has a first end abutting the second silicide layer, and a second end; and the second end of the first contact structure and the second end of the second contact structure are substantially coplanar.

10. The integrated circuit of claim 9, wherein the first silicide layer comprises nickel silicide, and the second silicide layer comprises nickel silicide.

11. An integrated circuit, comprising:
a p-channel field effect transistor (PFET) comprising:
a gate electrode structure, and a first pair of p-type source/drain (S/D) terminals adjacent the PFET gate electrode structure, the first pair of p-type S/D terminals each having a first portion disposed partially within a recess in an N-well and a second portion partially disposed outside the recess;
an n-channel field effect transistor (NFET) comprising:
a gate electrode structure, and a first pair of n-type S/D terminals adjacent the NFET gate electrode structure and disposed above a p-type substrate; and
a planar Zener diode, comprising:
a p-type junction layer having a first major surface and a second major surface, the first major surface of the p-type junction layer disposed in direct contact with the p-type substrate, and a first portion of the p-type junction layer disposed in a recess in the p-type substrate; and
an n-type junction layer having a first major surface and a second major surface, the first major surface of the n-type junction layer disposed directly on a first portion of the second major surface of the p-type junction layer.

12. The integrated circuit of claim 11, further comprising:
a first contact structure having a first end and a second end, the first end of the first contact structure disposed directly on the second major surface of the p-type junction layer; and
a second contact structure having a first end and a second end, the first end of the second contact structure disposed directly on the second major surface of the n-type junction layer;
wherein the second end of the first contact structure and the second end of the second contact structure are substantially coplanar.

13. The integrated circuit of claim 11, further comprising:
a first silicide layer disposed on a second portion of the second major surface of the p-type junction layer; and
a second silicide layer disposed on the second major surface of the n-type junction layer.

14. The integrated circuit of claim 13, wherein the first silicide layer is nickel silicide and the second silicide layer is nickel silicide.

15. The integrated circuit of claim 13, further comprising:
a first contact structure having a first end and a second end, the first end of the first contact structure disposed directly on the first silicide layer; and
a second contact structure having a first end and a second end, the first end of the second contact structure disposed directly on the second silicide layer;
wherein the second end of the first contact structure and the second end of the second contact structure are substantially coplanar.

16. An integrated circuit, comprising:
a p-channel field effect transistor (PFET);
an n-channel field effect transistor (NFET); and
a planar Zener diode having a first junction layer of a first conductivity type, and a second junction layer of a second conductivity type;
a first contact structure in electrical contact with the first junction layer; and
a second contact structure in electrical contact with the second junction layer;
wherein a portion of the first junction layer is disposed within a recess in a substrate of the integrated circuit.

17. The integrated circuit of claim 16, further comprising a first shallow trench isolation structure (STI) disposed so as to at least partially isolate the planar Zener diode from the substrate.

18. The integrated circuit of claim 16, further comprising:
a first silicide layer disposed between the first contact structure and the first junction layer; and
a second silicide layer disposed between the second contact structure and the second junction layer.

19. The integrated circuit of claim 16, wherein the PFET includes a pair of source/drain (S/D) terminals that are partially disposed in a respective pair of recesses, and the pair of S/D terminals are epitaxial layers; and the first junction layer and the second junction layer are epitaxial layers.

20. The integrated circuit of claim 17, further comprising:
a well of the second conductivity type disposed in the substrate; and
a second STI structure disposed in the substrate so as to at least partially isolate the well from the substrate;
wherein the PFET has a pair of source/drain (S/D) terminals disposed partially within the well and partially above the well; the NFET has a pair of S/D terminals disposed at least partially above the substrate; and a metal silicide is disposed between each of the first and second contact structures and the first and second junction layers respectively.

* * * * *